US008685622B2

(12) United States Patent
Loccufier et al.

(10) Patent No.: US 8,685,622 B2
(45) Date of Patent: Apr. 1, 2014

(54) METHOD FOR PREPARING A LITHOGRAPHIC PRINTING PLATE

(75) Inventors: Johan Loccufier, Zwijnaarde (BE); Paul Callant, Edegem (BE); Jens Lenaerts, Turnhout (BE); Ineke Van Severen, Antwerpen (BE)

(73) Assignee: Agfa Graphics NV, Mortsel (BE)

(*) Notice: Subject to any disclaimer, the term of this patent is extended or adjusted under 35 U.S.C. 154(b) by 56 days.

(21) Appl. No.: 13/264,350

(22) PCT Filed: Apr. 21, 2010

(86) PCT No.: PCT/EP2010/055237
§ 371 (c)(1),
(2), (4) Date: Oct. 13, 2011

(87) PCT Pub. No.: WO2010/122042
PCT Pub. Date: Oct. 28, 2010

(65) Prior Publication Data

US 2012/0034565 A1 Feb. 9, 2012

Related U.S. Application Data

(60) Provisional application No. 61/172,799, filed on Apr. 27, 2009.

(30) Foreign Application Priority Data

Apr. 24, 2009 (EP) .................................... 09158692

(51) Int. Cl.

| | |
|---|---|
| ***G03F 7/00*** | (2006.01) |
| ***G03F 7/26*** | (2006.01) |
| ***B41F 7/00*** | (2006.01) |
| ***B41N 1/00*** | (2006.01) |
| ***B41M 5/00*** | (2006.01) |

(52) U.S. Cl.
USPC ..................... 430/302; 430/270.1; 430/270.2; 430/294; 430/296; 430/309; 101/450.1; 101/453; 101/463.1

(58) Field of Classification Search
USPC .......... 430/270.1, 302; 101/450.1, 453, 463.1
See application file for complete search history.

(56) References Cited

U.S. PATENT DOCUMENTS

| | | | |
|---|---|---|---|
| 3,971,660 | A | 7/1976 | Staehle |
| 4,284,705 | A | 8/1981 | Phlipot et al. |
| 4,917,977 | A | 4/1990 | Smothers |
| 2006/0019196 | A1 | 1/2006 | Miyoshi |
| 2011/0287364 | A1 | 11/2011 | Callant |

FOREIGN PATENT DOCUMENTS

| | | | |
|---|---|---|---|
| EP | 0 601 240 | A1 | 6/1994 |
| EP | 770494 | A | 5/1997 |
| EP | 770495 | A1 | 5/1997 |
| EP | 770496 | A1 | 5/1997 |
| EP | 770497 | A1 | 5/1997 |
| EP | 1 142 707 | A1 | 10/2001 |
| EP | 1342568 | A1 | 9/2003 |
| EP | 1 356 926 | A1 | 10/2003 |
| EP | 1 564 020 | A1 | 8/2005 |
| EP | 1 614 538 | A2 | 1/2006 |
| EP | 1 614 541 | A2 | 1/2006 |
| EP | 1614539 | A1 | 1/2006 |
| EP | 1736312 | A1 | 12/2006 |
| EP | 1 767 353 | A2 | 3/2007 |
| EP | 1859935 | A1 | 11/2007 |
| EP | 1859936 | A1 | 11/2007 |
| EP | 1 914 068 | A1 | 4/2008 |
| EP | 1 914 069 | A1 | 4/2008 |
| EP | 1614540 | B1 | 9/2008 |
| EP | 1974911 | A1 | 10/2008 |
| EP | 1974912 | A1 | 10/2008 |
| EP | 2 072 570 | A1 | 6/2009 |
| GB | 1 419 512 | | 12/1975 |
| WO | 2006/005688 | A1 | 1/2006 |
| WO | WO 2006005688 | A1 * | 1/2006 |
| WO | 2006/037716 | A1 | 4/2006 |
| WO | 2006/136543 | A | 12/2006 |
| WO | 2006/136543 | A2 | 12/2006 |
| WO | 2007/045515 | A1 | 4/2007 |
| WO | 2007/148621 | A1 | 12/2007 |
| WO | 2010/031758 | A1 | 3/2010 |
| WO | 2010/079020 | A1 | 7/2010 |
| WO | WO 2010079020 | A1 * | 7/2010 |

OTHER PUBLICATIONS

European Search Report issued in European Application No. EP 09158692.5, dated Sep. 8, 2009.
International Search Report issued in PCT Application No. PCT/EP2010/055237, dated May 10, 2012.
Exner, Otto, "A Critical Compilation of Substituent Constants," *Correlation Analysis in Chemistry: Recent Advances,* Chapter 10, Eds. Chapman and Shorter, Plenum Press, New York, pp. 439-505 (1978).
Krygowski, Tadeusz M., et al., "How the Substituent Effect Influences π-Electron Delocalisation in the Ring of Reactants in the Reaction Defining the Hammett Substituent Constants $\sigma_n$ and $\sigma_p$," *International Journal of Molecular Sciences,* vol. 6, pp. 45-51 (2005).
March, Jerry, "Effects of Structure on Reactivity," *Advanced Organic Chemistry: Reactions, Mechanisms, and Structure,* Fourth Edition, John Wiley & Sons, Inc. (1992).

* cited by examiner

*Primary Examiner* — Chanceity Robinson
(74) *Attorney, Agent, or Firm* — Leydig, Voit & Mayer, Ltd.

(57) ABSTRACT a method for preparing a lithographic printing plate that includes imagewise exposing a lithographic printing plate precursor comprising a coating provided on a support having a hydrophilic surface, the coating containing thermoplastic polymer particles and an infrared radiation absorbing dye characterized in that the coating further comprises a phenolic stabilizer.

10 Claims, No Drawings

METHOD FOR PREPARING A LITHOGRAPHIC PRINTING PLATE

CROSS-REFERENCE TO RELATED APPLICATIONS

This application is the national stage of international patent application No. PCT/EP2010/055237, filed on Apr. 21, 2010, which claims the benefit of European Patent Application No. 09158692.5, filed on Apr. 24, 2009, and of U.S. Provisional Patent Application No. 61/172,799, filed on Apr. 27, 2009, all of which are hereby incorporated by reference in their entireties.

FIELD OF THE INVENTION

The present invention relates to a heat-sensitive, negative-working lithographic printing plate precursor.

BACKGROUND OF THE INVENTION

Negative working thermal sensitive printing plate precursors comprising thermoplastic polymer particles, of which the imaging mechanism is based on coalescence or coagulation of the polymer particles, have been disclosed in several applications. For example EP-As 770 494, 770 495, 770 496 and 770 497 disclose printing plate precursors comprising thermoplastic particles which are, after exposure, processed on press by supplying ink and/or fountain solution.

EP-A 1 342 568 and WO2006/037716 disclose a method of making a lithographic printing plate wherein a precursor comprising thermoplastic particles is, after exposure, processed in a gum solution. EP-As 1 614 539 and 1 614 540 disclose a method of making a lithographic printing plate wherein a precursor comprising thermoplastic particles is, after exposure, processed in an alkaline solution.

EP-As 1 736 312 and 1 910 082 disclose lithographic printing plate precursors comprising thermoplastic particles and an infrared dye, the infrared dye being capable of forming a print-out image upon exposure to infrared radiation.

EP-As 1 859 935 and 1 859 936 disclose a lithographic printing plate precursor comprising thermoplastic particles having an average particle size between 10 and 40 nm and wherein the amount of the infrared dye is adjusted as function of the particle size of the polymer particles.

WO 2010/031758 discloses a lithographic printing plate precursor comprising thermoplastic polymer particles and an infrared dye characterized in that the dye contains a substituent selected from bromo and iodo.

It has been observed that a disadvantage of precursors comprising well known infrared dyes may be a poor stability when stored under daylight conditions. It seems that the infrared dyes may be subjective to oxidative and/or light induced deterioration when the precursors are stored under daylight conditions. This instability may result in a loss of sensitivity, a worsening of the clean-out behaviour, i.e. removal of the non-image areas during development, and a change of colour of the precursor. These phenomena become more pronounced under prolonged storage under daylight conditions. Exposure to daylight may occur, for example, for the uppermost precursor of a stack of precursors loaded in a platesetter. It has been observed that when the platemaking process is resumed, for example after a couple of days, the lithographic properties of such an uppermost precursor of a stack of precursors may have changed compared with those of the other precursors of the stack. This may necessitate a remake of a printing plate resulting in productivity loss at the customer site.

EP 2072570 discloses lithographic printing plate precursors comprising thermoplastic polymer particles and infrared dyes having a specific central structural element characterized by an improved storage stability.

Adding stabilizers is another strategy to optimize the stability of infrared dyes towards oxidative and/or light induced deterioration. Numerous classes of stabilizers have been reported in the literature on lightfastness and oxidation stability of dyes. UV absorbers, hindered amine light stabilizers, i.e. HALS-compounds, and different types of antioxidants are generally used. Typical UV-absorbers are 2-hydroxyl benzophenones, 2-hydroxyphenyl benzotriazoles, 2-hydroxyphenyl triazine, bis oxalyl amide derivatives and cinnamate derivatives. Typical HALS-compounds are 2,2,6,6-tetramethyl piperidine derivatives and the infrared radiation absorbing corresponding piperinyloxy radicals. Typical antioxidants can be selected from sterically hindered phenols, tocopheroles, catechol derivatives, hydroquinone derivatives, gallic acid esters, hydrazides, hydroxyl amines, hydroxamic acids, phosphites, thioethers and reductones such as ascorbic acid and its derivatives. EP-A 1 910 082 discloses the use of specific carboxylic acids to improve the daylight stability of printing plate precursors comprising specific infrared dyes and hydrophobic thermoplastic particles. Phenyl glycine is disclosed as being particularly preferred.

EP-As 1 974 911 and 1 974 912 both disclose the use of ascorbic or erythorbic acid derivatives in lithographic printing plate precursors comprising an infrared dye and hydrophobic thermoplastic particles.

However, adding such stabilizers to a lithographic printing plate precursor may lead to an unacceptable worsening of the lithographic properties, especially the sensitivity, of the printing plate precursors. Therefore, there is still a need for more optimal stabilizers to improve the storage and light stability of heat sensitive lithographic printing plate precursors without adversely affecting their other lithographic properties.

SUMMARY OF THE INVENTION

It is an object of the invention to provide lithographic printing plate precursors comprising thermoplastic particles and an infrared dye wherein the precursor has improved daylight stability.

The object of the present invention is realized with a lithographic printing plate precursor according to claim 1. Preferred embodiments of the present invention are disclosed in the dependent claims.

DETAILED DESCRIPTION OF THE INVENTION

Phenolic Stabilizers

It has been found that the object of the present invention is realized by a lithographic printing plate precursor comprising a coating provided on a support having a hydrophilic surface, the coating containing thermoplastic particles and an infrared radiation absorbing dye characterized in that the coating further comprises a phenolic compound containing a phenolic ring, the phenolic ring having at least one substituent according to Formula I and optional additional substituents having a Hammett sigma para-value ($\sigma_p$) less than or equal to 0.3;

Formula I

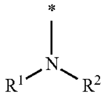

wherein

* is a linking position to the aromatic ring of the phenolic compound;

$R^1$ and $R^2$ are independently selected from the group consisting of a hydrogen, an optionally substituted alkyl group, an optionally substituted alkenyl group, an optionally substituted alkynyl group, an optionally substituted alkaryl group, an optionally substituted aralkyl group and an optionally substituted aryl or heteroaryl group;

$R^1$ and $R^2$ may represent the necessary atoms to form a five to eight membered ring, with the proviso that $R^1$ and $R^2$ are bonded to N via a carbon-nitrogen bond;

any of $R^1$ and $R^2$ together with N and the phenolic ring may represent the necessary atoms to form a five or six membered ring.

The phenolic compound is preferably selected from the group consisting of a phenol, a naphtol and a hydroxy substituted indole.

A phenolic ring according to the present invention is defined as a carbocyclic aromatic ring which is at least substituted by one hydroxyl group. The phenolic ring may be further substituted or ring annulated. However, the optional additional substituents have a Hammett sigma para-value ($\sigma_p$) (i.e. σ value of the optional additional substituents when located in para-position relative to the hydroxyl group on the phenolic ring) less than or equal to 0.3. Substituents having a Hammett sigma para-value ($\sigma_p$) greater than 0.3 are typically carboxylic acids, esters, ketones, aldehydes or even stronger electron withdrawing groups. Preferred substituents having a Hammett sigma para-value ($\sigma_p$) less than or equal to 0.3 are selected from the group consisting of an optionally substituted alkyl group, an optionally substituted aryl group, a halogen, an alkoxy group, a thioether, an amino group and a hydroxyl group.

A selection of $\sigma_p$-values of various substituents is given below (from J. March, Advanced Organic Chemistry, fourth edition, Wiley Interscience, ISBN0-471-60180-2, p. 280 and International Journal of Molecular Sciences, 2005, 6, p. 45-51).

| substituent | $\sigma_p$ |
|---|---|
| $O^-$ | −0.81 |
| $NMe_2$ | −0.63 |
| $NH_2$ | −0.57 |
| OH | −0.38 |
| OMe | −0.28 |
| $CMe_3$ | −0.15 |
| Me | −0.14 |
| H | 0 |
| Ph | 0.05 |
| $COO^-$ | 0.11 |
| F | 0.15 |
| Cl | 0.24 |
| Br | 0.26 |
| I | 0.28 |
| N═N—Ph | 0.34 |
| CHO | 0.43 |
| COOH | 0.44 |
| COOR | 0.44 |

-continued

| substituent | $\sigma_p$ |
|---|---|
| COMe | 0.47 |
| $CF_3$ | 0.53 |
| $NH_3^+$ | 0.6 |
| CN | 0.7 |
| $SO_2Me$ | 0.73 |
| $NO_2$ | 0.81 |
| $N^+Me_3$ | 0.82 |
| $NN^+$ | 1.93 |

Further $\sigma_p$-values can be found in Chapman and Shorter, Correlation Analysis in Chemistry, Recent Advances, Plenum, N.Y., 1978, p. 439-540.

Particularly preferred phenolic compounds according to the present invention are represented by formulae II or III.

Formula II

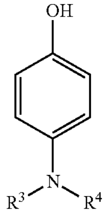

Formula III

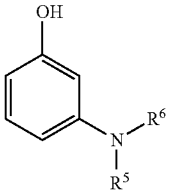

wherein any of $R^3$ to $R^6$ are independently selected from the group consisting of a hydrogen, an optionally substituted alkyl group, an optionally substituted alkenyl group, an optionally substituted alkynyl group, an optionally substituted alkaryl group, an optionally substituted aralkyl group and an optionally substituted aryl or heteroaryl group;

$R^3$ and $R^4$ and $R^5$ and $R^6$ may represent the necessary atoms to form a five to eight membered ring, with the proviso that any of $R^3$ to $R^6$ is bonded to nitrogen via a carbon nitrogen bond;

any of $R^3$ to $R^6$ together with N and the phenolic ring may represent the necessary atoms to form a five or six membered ring.

In a further preferred embodiment, the phenolic compound according to the present invention is represented by Formula IV Formula IV

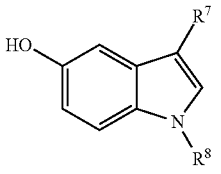

wherein $R^7$ and $R^8$ are independently selected from the group consisting of a hydrogen, an optionally substituted alkyl group, an optionally substituted alkenyl group, an optionally substituted alkynyl group, an optionally substituted alkaryl group, an optionally substituted aralkyl group and an optionally substituted aryl or heteroaryl group.

The phenolic stabilizers according to the present invention are preferably added as additional ingredients to the coating solution of the precursor. However, the phenolic stabilizers may also be linked, for example chemically by a covalent bond, to other ingredients present in the composition of the precursor such as for example the infrared dye or the contrast dye.

The phenolic stabilizers are preferably added to the coating solution of the precursor as an aqueous solution. Depending on the particular compound used, an alkaline aqueous solution or a mixture of water/alcohol may be used to dissolve the stabilizers. When the solubility of the phenolic stabilizers is insufficient or if the stability of the solution is unsatisfactory, a solution containing both the phenolic stabilizers and a compound comprising at least one phosphonic acid group or at least one phosphoric acid group or a salt thereof, as described in WO2007/045515, may be used.

It has been observed that, when preparing the coating solution of the precursor, the addition of the solution of the phenolic stabilizers may influence the colloidal stability of the coating solution depending on the sequence wherein all ingredients are added. It has been observed that adding the solution of the phenolic stabilizers before or after the addition of the polymer particles to the coating solution, depending on the phenolic stabilizers used, may improve the colloidal stability of the coating solution. Using stabilizers chemically bonded to another ingredient of the coating, such as the infrared dye or the contrast dye, may be advantageous in view of the colloidal stability of the coating solution.

Examples of stabilizers according to the present invention are given in Table 1.

TABLE 1

| | |
|---|---|
| 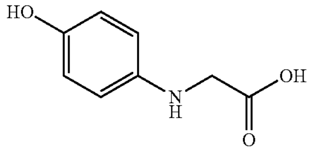 | ST-01 |
| 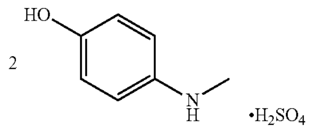 | ST-02 |
| 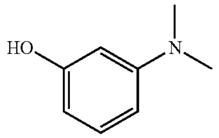 | ST-03 |
| 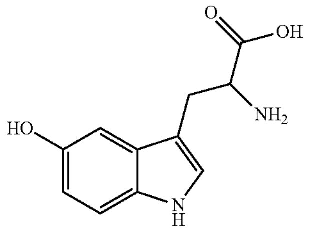 | ST-04 |
| 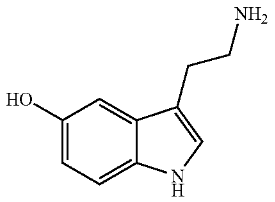 | ST-05 |
| 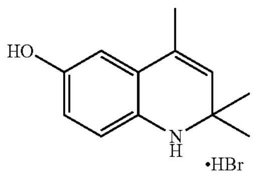 | ST-06 |

TABLE 1-continued
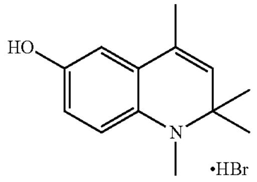
ST-07
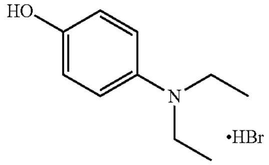
ST-08
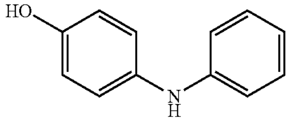 [SMILES: Oc1ccc(Nc2ccccc2)cc1]
ST-09
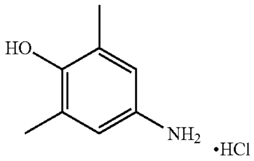
ST-10
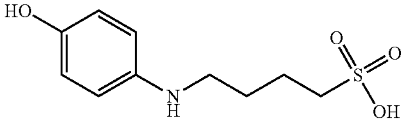 [SMILES: O=S(=O)(O)CCCCNc1ccc(O)cc1]
ST-11
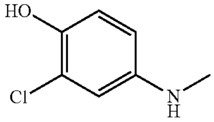
ST-12
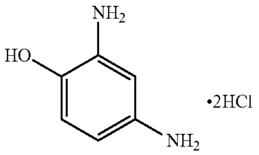
ST-13
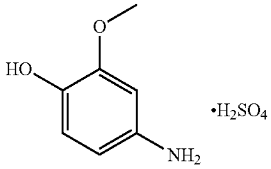
ST-14
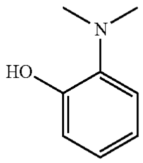
ST-15
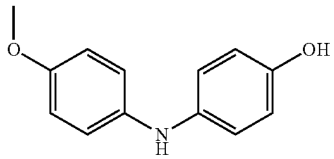 [SMILES: COc1ccc(Nc2ccc(O)cc2)cc1]
ST-16

TABLE 1-continued
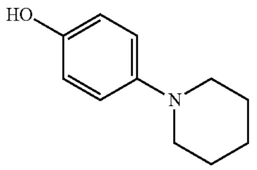 [SMILES: Oc1ccc(N2CCCCC2)cc1]
ST-17
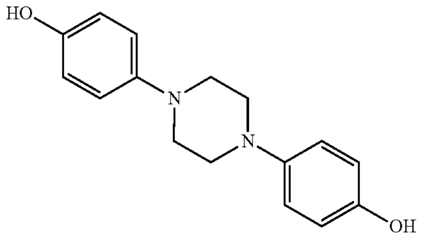 [SMILES: Oc1ccc(N2CCN(c3ccc(O)cc3)CC2)cc1]
ST-18
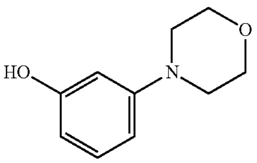 [SMILES: Oc1cccc(N2CCOCC2)c1]
ST-19
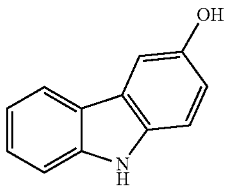 [SMILES: Oc1ccc2[nH]c3ccccc3c2c1]
ST-20
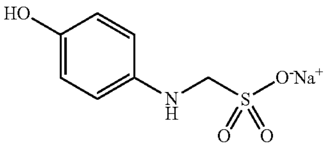
ST-21
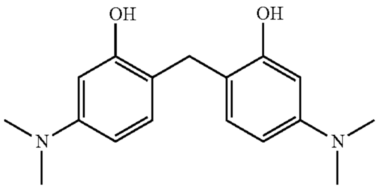
ST-22
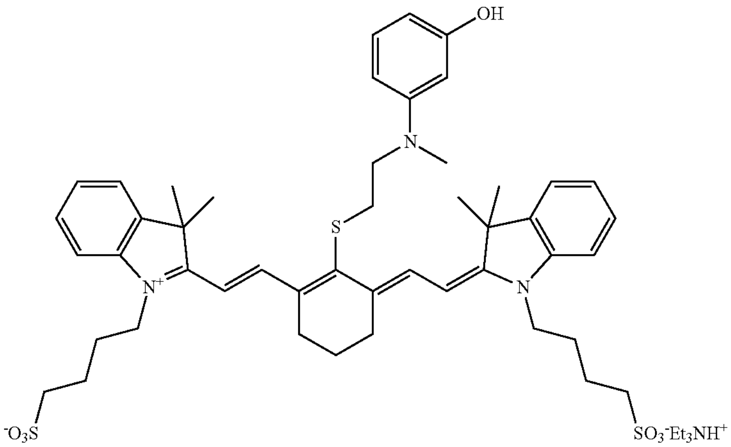
ST-23

TABLE 1-continued
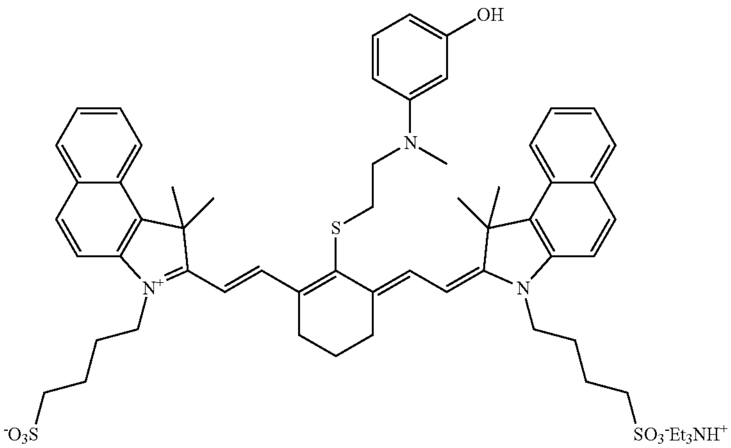
ST-24
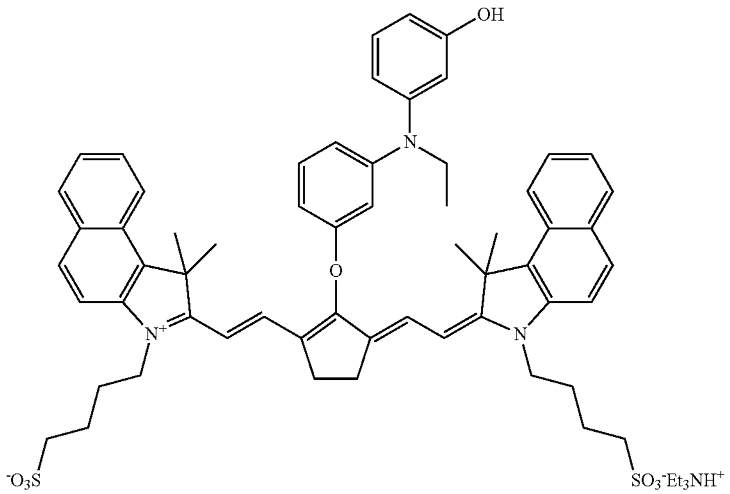
ST-25
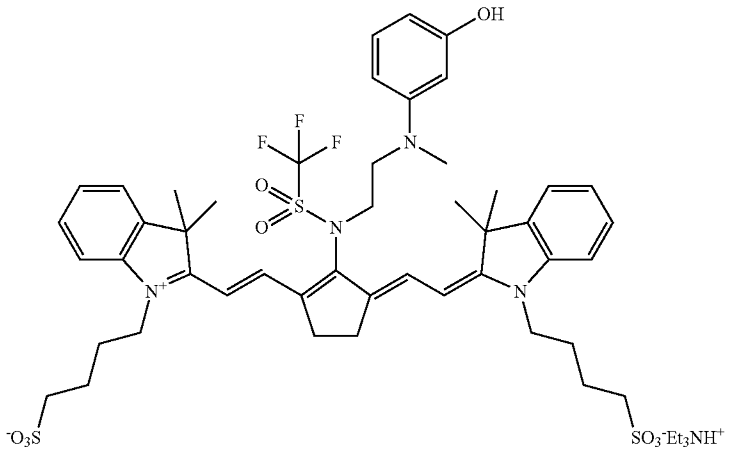
ST-26

TABLE 1-continued
ST-27
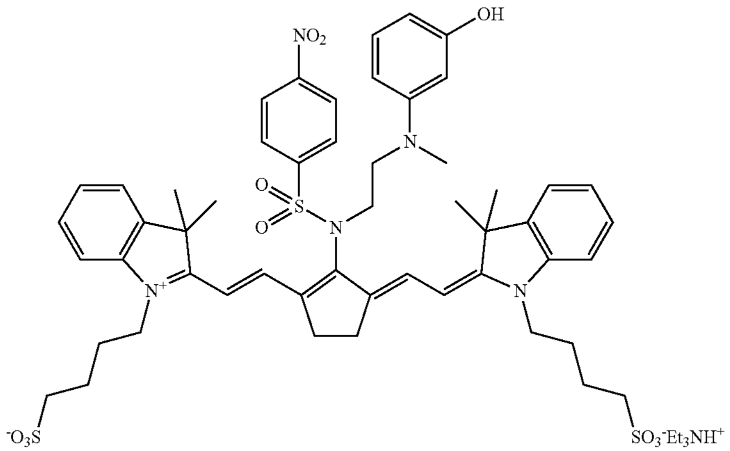
ST-28
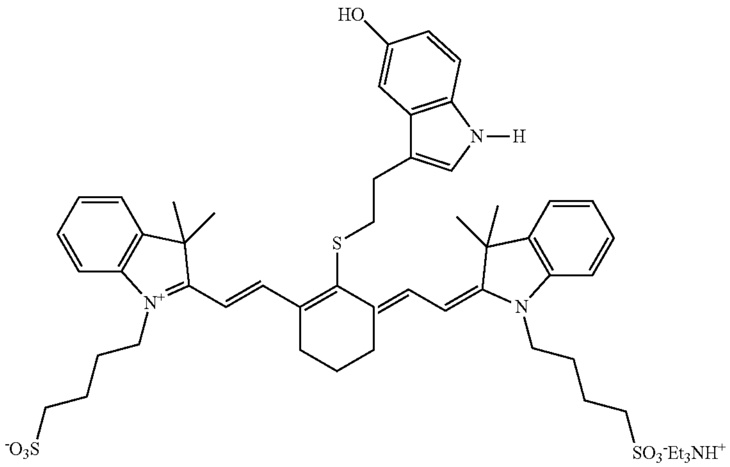
ST-29
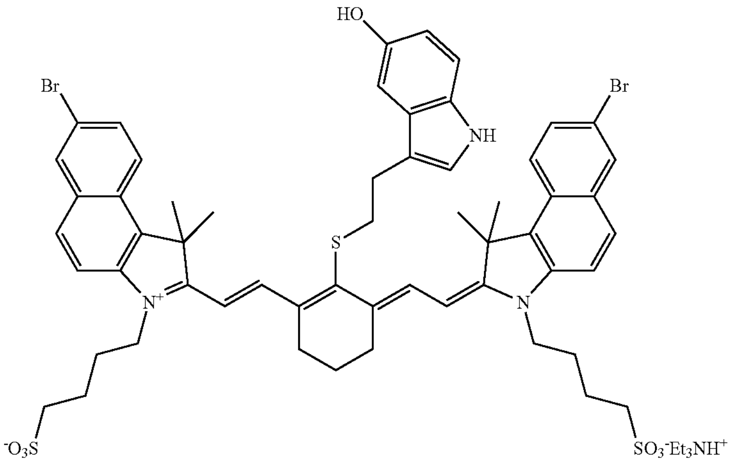

TABLE 1-continued
ST-30
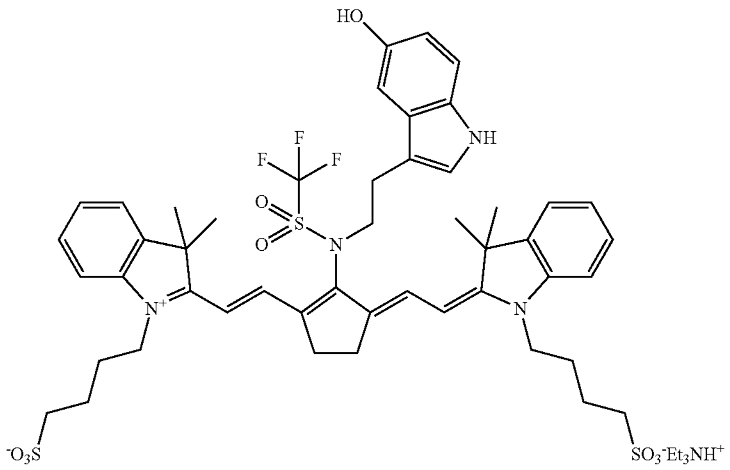
ST-31
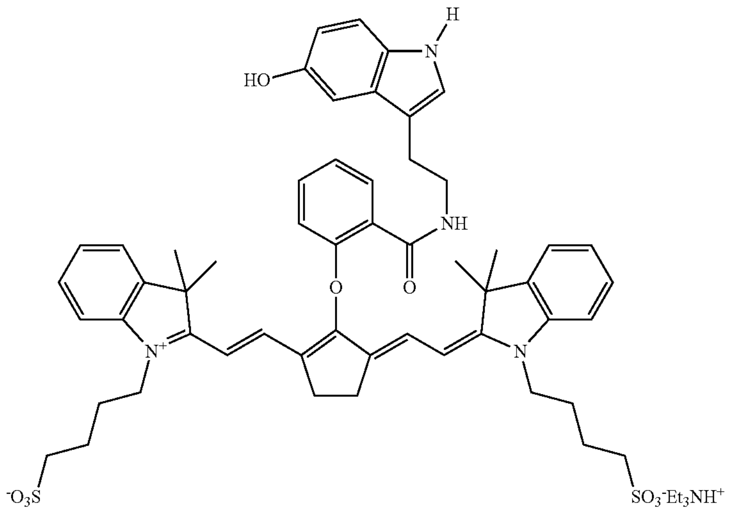
ST-32
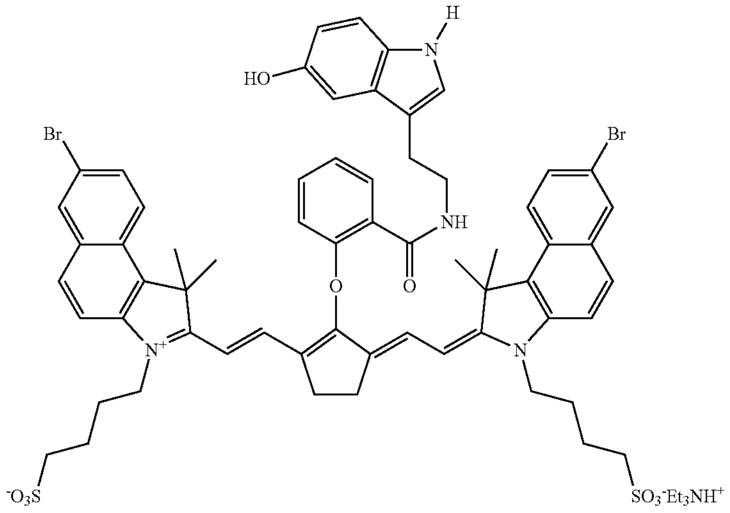

TABLE 1-continued
ST-33
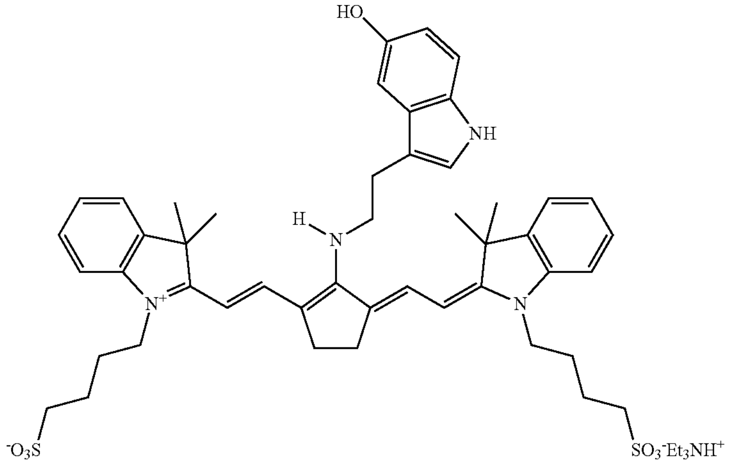
ST-34
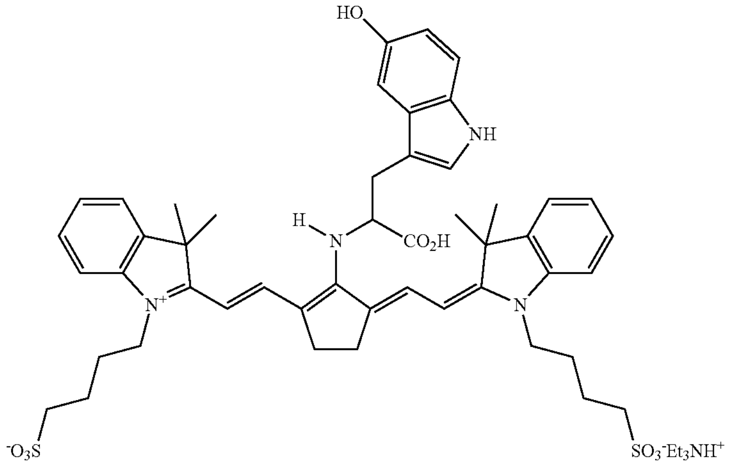
ST-35
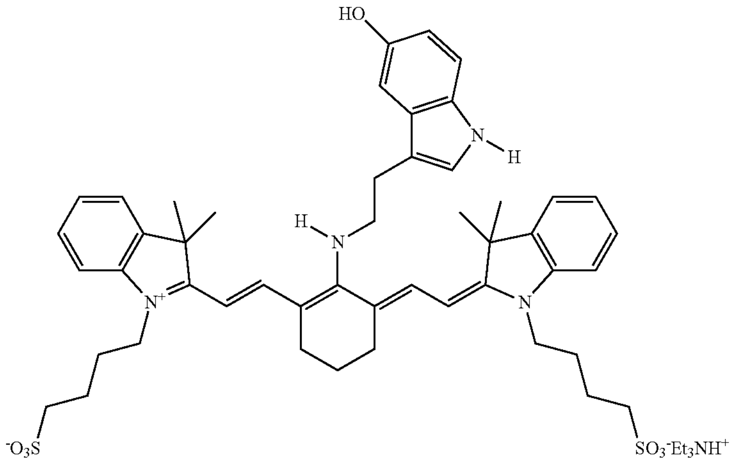

TABLE 1-continued
ST-36
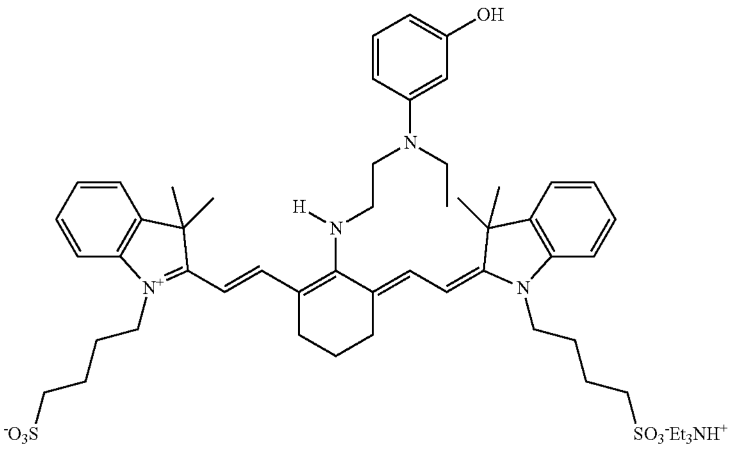
ST-37
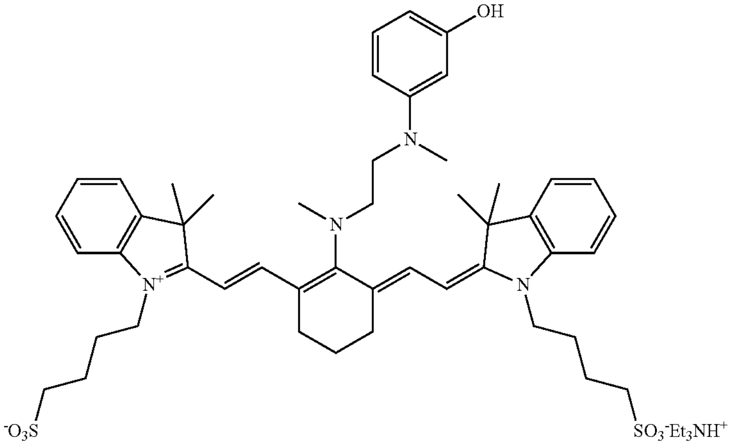
ST-38
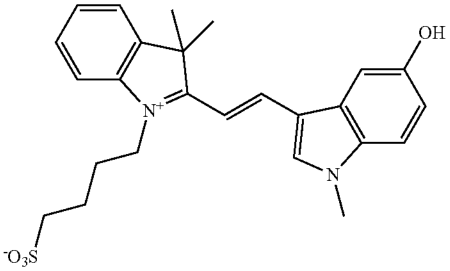
ST-39
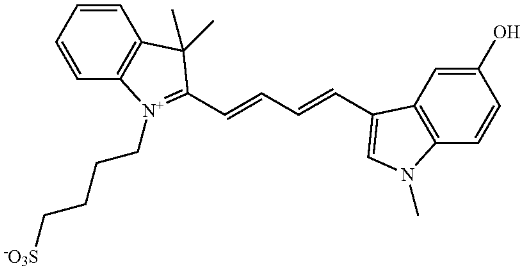

TABLE 1-continued

ST-40

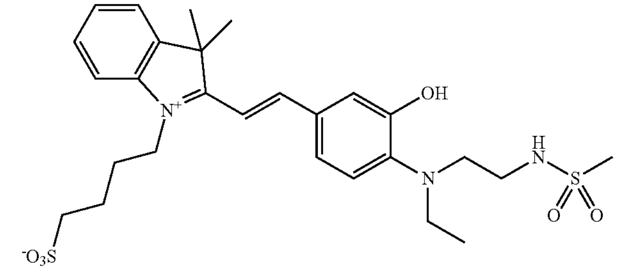

ST-41

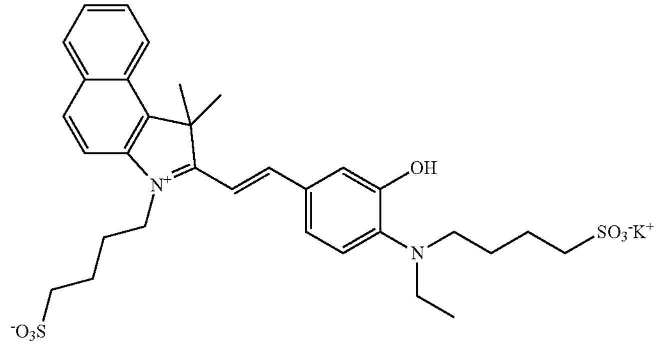

ST-42

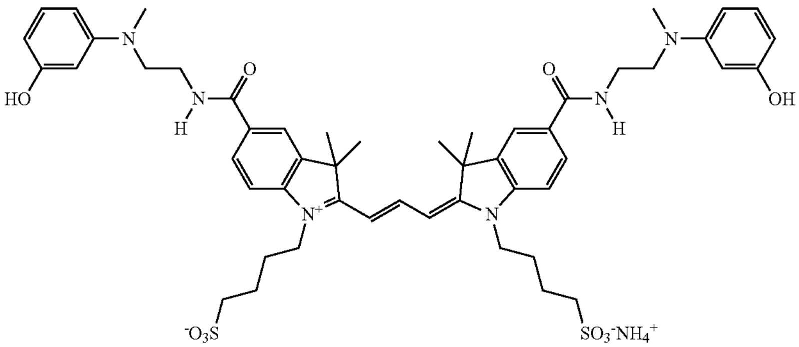

Infrared Dyes

The coating contains a dye which absorbs infrared (IR) radiation and converts the absorbed energy into heat. Such dyes are also referred to as infrared dyes or IR dyes. Preferred infrared dyes are cyanine, merocyanine, indoaniline, oxonol, pyrilium and squarilium dyes.

Preferred infrared dyes are water compatible, most preferably, water soluble. Cyanine dyes are particularly preferred. Examples of such cyanine dyes are disclosed in EP-A 1 142 707, paragraph [143]. Other preferred infrared dyes are described in EP-A 1 614 541 (page 20 line 25 to page 44 line 29) and EP-As 1 736 312 (paragraphs [0008] to [0021]) and 1 910 082.

Particular preferred infrared dyes, resulting in a higher sensitivity, are disclosed in WO 2010/031758. This application discloses infrared dyes which contain a substituent selected from bromo and iodo. Preferred infrared dyes containing a substituent selected from bromo and iodo have a structure according to Formula V, Formula V

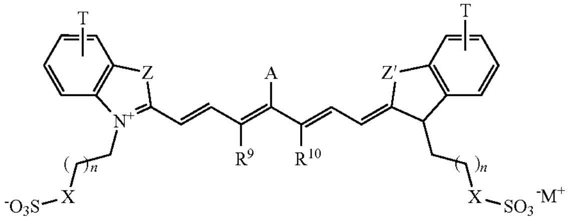

wherein

Z and Z' represent —S—, —CR$^a$R$^b$13 or —CH═CH—;

A represents hydrogen, an optionally substitued alkyl, aralkyl or aryl group, halogen, —OR$^c$, —SR$^d$, —SO$_2$R$^e$, —NR$^f$R$^g$, —NR$^h$(SO$_2$R$^i$) or —NR$^j$(CO$_2$R$^k$) wherein R$^c$ represents an optionally substituted aryl group, R$^d$ represents an optionally substituted alkyl, aralkyl, aryl or heteroaryl group, R$^e$ represents an optionally substituted alkyl, aryl, or heteroaryl group, R$^f$ represents an optionally substituted alkyl, aralkyl or aryl group, $R^g$ represents an optionally substituted aryl group, $R^h$ represents an optionally substituted alkyl or aryl group, $R^i$ represents an optionally substituted alkyl or aryl group or —$NR^{i1}R^{i2}$ wherein $R^{i1}$ and $R^{i2}$ represent hydrogen, an optionally substituted alkyl or aryl group, $R^i$ represents an optionally substituted alkyl or aryl group;

T and T' independently represent hydrogen, alkyl, alkoxy, cyano, —$CO_2R^k$, —$CONR^1R^m$, —$SO_2NR^0R^p$ or an annulated benzo ring wherein $R^1$, $R^m$ represent hydrogen, an optionally substituted alkyl or aryl group, $R^n$ represents an optionally substituted alkyl or aryl group and $R^o$ and $R^p$ represent hydrogen, an optionally substituted alkyl or aryl group;

$R^9$ and $R^{10}$ represent the necessary atoms to form a ring;

n represents an integer ranging from 0 to 3;

X represents —$CH_2$—, —O— or —S—; and $M^+$ represents a counterion to balance the charge.

Other preferred infrared dyes are those disclosed in EP 2072570. These infrared dyes are as such less sensitive towards oxidative and/or light induced deterioration. In combination with the phenolic stabilizers according to the present invention the stability of these infrared dyes in lithographic printing plate precursors is further improved. The infrared dyes disclosed in EP 2072570 have a structural element according to Formula VI, Formula VI

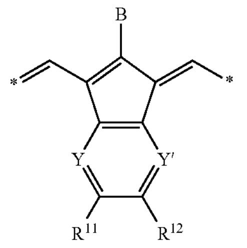

wherein

B represents hydrogen, halogen or a monovalent organic group;

Y and Y' independently represent —CH— or —N—;

$R^{11}$ and $R^{12}$ independently represent hydrogen, an optionally substituted alkyl or aryl group or represent the necessary atoms to form a ring;

* represent the linking positions to the rest of the molecule.

The infrared dye amount is preferably at least 6% by weight, more preferably at least 8% by weight, relative to the total weight of the ingredients of the image recording layer.

As described in EP-A 1 859 936 the amount of infrared dye may be adjusted to the particle size of the thermoplastic particles.

Thermoplastic Particles

The thermoplastic particles have an average particle diameter from 10 nm to 200 nm, preferably from 15 to 150 nm, more preferably from 20 to 75 nm, most preferably from 25 nm to 50 nm. The average particle diameter referred to in the claims and the description of this application is meant to be the average particle diameter measured by Photon Correlation Spectrometry, also known as Quasi-Elastic or Dynamic Light-Scattering, unless otherwise specified. The measurements were performed according the ISO 13321 procedure (first edition, 1996 July 01) with a Brookhaven BI-90 analyzer, commercially available from Brookhaven Instrument Company, Holtsville, N.Y., USA. The amount of thermoplastic polymer particles is preferably at least 50, more preferably at least 60, most preferably at least 70% by weight relative to the total weight of all the ingredients in the image-recording layer.

Preferred thermoplastic polymer particles and their preparation are disclosed in EP 1 914 068 (paragraph [0030] and [0031]) and WO 2010/031758.

Binder

The image-recording layer may further comprise a hydrophilic binder. Examples of suitable hydrophilic binders are homopolymers and copolymers of vinyl alcohol, (meth)acrylamide, methylol (meth)acrylamide, (meth)acrylic acid, hydroxyethyl (meth)acrylate, maleic anhydride/vinylmethylether copolymers, copolymers of (meth)acrylic acid or vinylalcohol with styrene sulphonic acid. Preferably, the hydrophilic binder comprises polyvinylalcohol or polyacrylic acid.

The amount of hydrophilic binder may be between 2 and 30% by weight, preferably between 2 and 20% by weight, more preferably between 3 and 10% by weight relative to the total weight of all ingredients of the image-recording layer. The amount of the hydrophobic thermoplastic polymer particles relative to the amount of the binder is preferably between 8 and 25, more preferably between 10 and 22, most preferably between 12 and 20.

Contrast Dyes

Colorants, such as dyes or pigments, which provide a visible colour to the coating and remain in the exposed areas of the coating after the developing step, may be added to the coating. The areas which are not removed during the developing step then form a visible image on the printing plate and inspection of the lithographic image on the developed printing plate becomes feasible. Typical examples of such contrast dyes are the amino-substituted tri- or diaryl-methane dyes. In a preferred embodiment, anionic tri- or diaryl-methane dyes are used. Dyes which, combined with specific additives, only slightly colour the coating but which become intensively coloured after exposure, as described in for example WO2006/005688 are also of interest. Other preferred contrast dyes are those described in EP-A 1 914 069.

Typical contrast dyes may be combined, or even replaced by infrared dyes, capable of forming a visible colour upon exposure to infrared radiation, as those described in EP-As 1 736 312 and 1 910 082.

Other Ingredients

Optionally, the coating may further contain additional ingredients. These ingredients may be present in the image-recording layer, i.e. the layer comprising the polymer particles, or in an optional other layer. For example, additional binders, polymer particles such as matting agents and spacers, surfactants such as perfluoro-surfactants, silicon or titanium dioxide particles, development inhibitors, development accelerators, colorants, metal complexing agents are well-known components of lithographic coatings. Preferably the image-recording layer comprises an organic compound, characterised in that said organic compound comprises at least one phosphonic acid group or at least one phosphoric acid group or a salt thereof, as described in WO2007/045515.

Coating

The coating of the lithographic printing plate precursor applied to the support having a hydrophilic surface, comprises an image-recording layer and optional additional layers. The image-recording layer comprises thermoplastic polymer particles.

A protective layer may optionally be applied on the image-recording layer. The protective layer generally comprises at least one water-soluble polymeric binder, such as polyvinyl alcohol, polyvinylpyrrolidone, partially hydrolyzed polyvinyl acetates, gelatin, carbohydrates or hydroxyethylcellulose. The protective layer may contain small amounts, i.e. less then 5% by weight, of organic solvents.

The infrared dyes and the phenolic stabilizers according to the present invention mentioned above may be present in the image-recording layer or in the protective layer, or in both.

The thickness of the protective layer is not particularly limited but preferably is up to 5.0 μm, more preferably from 0.05 to 3.0 μm, most preferably from 0.10 to 1.0 μm.

The coating may further contain other additional layer(s) such as for example an adhesion-improving layer located between the image-recording layer and the support.

The coating may be applied on the support by any coating technique known in the art. After applying the coating, the applied layer(s) are dried as commonly known in the art. While drying the coating, in particular the image-recording layer, it is preferred to keep the temperature, measured as the wet coating temperature, below 45° C., more preferably below 40° C., most preferably below 35° C. and to keep the temperature, measured as the dry coating temperature, below 90° C., more preferably below 60° C.

Support

The support of the lithographic printing plate precursor has a hydrophilic surface or is provided with a hydrophilic layer. In one embodiment of the invention the support is a grained and anodized aluminum support. Preferred grained and anodized aluminum supports are for example disclosed in EP-A 1 914 069 (paragraphs [0059] to [0062]). A grained and anodized aluminum support is preferably subjected to a hydrophilizing treatment, a so called post-anodic treatment with for example polyvinyl phosphonic acid. However, it may be preferred to use a grained and anodized aluminum support without such a post-anodic treatment, for example when the exposed precursor will be processed in an alkaline solution. A preferred aluminum substrate, characterized by an arithmetical mean center-line roughness Ra of less then 0.45μ is described in EP 1 356 926. According to another embodiment, the support can also be a flexible support, which is provided with a hydrophilic layer. The flexible support is e.g. paper, plastic film, thin aluminum or a laminate thereof. Preferred examples of plastic film are poly-ethylene terephthalate film, polyethylene naphthalate film, cellulose acetate film, polystyrene film, polycarbonate film, etc. The plastic film support may be opaque or transparent. Particular examples of suitable hydrophilic layers that may be supplied to a flexible support for use in accordance with the present invention are disclosed in EP-A 601 240, GB 1 419 512, FR 2 300 354, U.S. Pat. Nos. 3,971,660, 4,284,705, EP 1 614 538, EP 1 564 020 and US 2006/0019196.

Exposure

Preferably, the printing plate precursor is imagewise exposed with infrared radiation, preferably near infrared radiation. The infrared radiation is converted into heat by an infrared dye as discussed above. The heat-sensitive lithographic printing plate precursor of the present invention is preferably not sensitive to visible radiation. Most preferably, the coating is not sensitive to ambient daylight, i.e. visible (400-750 nm) and near UV radiation (300-400 nm) at an intensity and exposure time corresponding to normal working conditions so that the material can be handled without the need for a safe light environment. The printing plate precursors of the present invention can be exposed to infrared radiation by means of e.g. LEDs or an infrared laser. Preferably lasers emitting near infrared radiation having a wavelength in the range from about 700 to about 1500 nm, e.g. a semiconductor laser diode, a Nd:YAG or a Nd:YLF laser, are used. Most preferably, a laser emitting in the range between 780 and 830 nm is used. In a preferred embodiment of this invention a useful lithographic image is obtained upon image-wise exposure of the printing plate precursor with infrared radiation having an energy density, measured at the surface of the precursor, of 250 $mJ/cm^2$ or less, more preferably of 200 $mJ/cm^2$ or less, most preferably of 180 $mJ/cm^2$ or less. With a useful lithographic image on the printing plate 2% dots (at 200 lpi) are perfectly visible on at least 1 000 prints on paper. Exposure is preferably carried out with commercially available platesetters. Due to the heat generated during the exposure step, the thermoplastic polymer particles may fuse or coagulate thereby forming a hydrophobic phase which corresponds to the printing areas of the printing plate. Coagulation may result from heat-induced coalescence, softening or melting of the thermoplastic polymer particles. There is no specific upper limit to the coagulation temperature of the thermoplastic polymer particles, however the temperature should be sufficiently below the decomposition temperature of the polymer particles. Preferably the coagulation temperature is at least 10° C. below the temperature at which the decomposition of the polymer particles occurs. The coagulation temperature is preferably higher than 50° C., more preferably above 100° C.

As an alternative, the printing plate precursor may be imagewise heated by a heating element to form an image.

Development

Development, i.e. removal of the exposed areas of the coating, may be carried out off-press in an alkaline aqueous solution or in a gum solution, on-press by supplying ink and/or fountain to the exposed precursor mounted in a printing press or by a combination of off-press and on-press development. Preferred embodiments are disclosed in WO 2010/031758.

EXAMPLES

Table 2 lists the light and oxygen stabilizers used as comparative stabilizers. They represent well known water compatibilized stabilizers to improve storage and light stability of dyes. COMP-ST-09 and 10 are phenolic compounds having besides an amino substituent according to Formula I an additional substituent having a Hammett sigma para-value ($\sigma_p$) greater than 0.3

TABLE 2

| | |
|---|---|
| 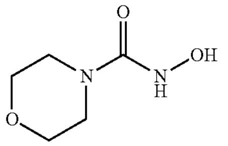 | COMP-ST-01 (see EP 1 460 114) |

TABLE 2-continued
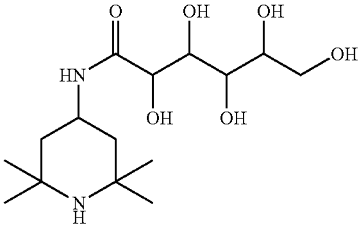 [SMILES: CC1(C)CC(NC(=O)C(O)C(O)C(O)C(O)CO)CC(C)(C)N1]
COMP-ST-02
(see JP 2000 095 760)
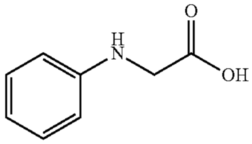 [SMILES: O=C(O)CNc1ccccc1]
COMP-ST-03
(see WO 2006 136 543)
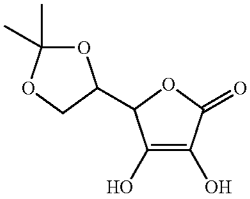
COMP-ST-04
(see EP 1 974 911)
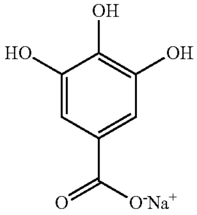
COMP-ST-05
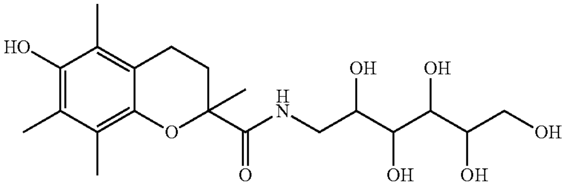 [SMILES: Cc1c(C)c2c(c(C)c1O)CCC(C)(C(=O)NCC(O)C(O)C(O)C(O)CO)O2]
COMP-ST-06
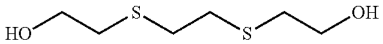
COMP-ST-07
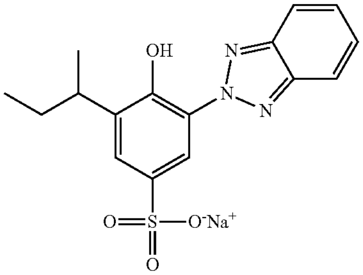
COMP-ST-08
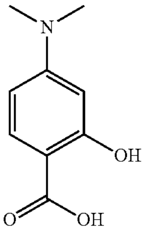
COMP-ST-09
($\sigma_p$ = 0.44)

TABLE 2-continued

| | |
|---|---|
| 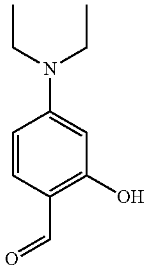 | COMP-ST-10 ($\sigma_p$ = 0.43) |

All materials used in the examples were readily available from standard sources such as Aldrich Chemical Co. (Belgium) and Acros (Belgium) unless otherwise specified.

In the following list, ingredients used in the examples are listed. Where appropriate, it is mentioned how the ingredient (as a solution, as a dispersion etc.) is used in the examples.

Chemfac PB-133, an alkyl ether phosphate surfactant from Chemax Inc.

SDS Ultrapure, sodium dodecyl sulphate from Applichem GmbH.

HEDP, an aqueous solution containing 6 wt. % 1-hydroxyethylidene-1,1-diphosphonic acid from Solutia.

Zonyl FS0100, an aqueous solution containing 5 wt. % of the fluorinated surfactant Zonyl FS0100 from Dupont.

Pigment, an aqueous blue pigment dispersion from Cabot Corporation containing 5 wt. % of the modified Cu phthalocyanine pigment IJX883.

Binder, an aqueous solution containing 1.5 wt. % Aqualic AS58 from Nippon Shokubai.

Dye, an aqueous solution (ethanol/water 50/50) containing 1.0 wt. % of the following dye:

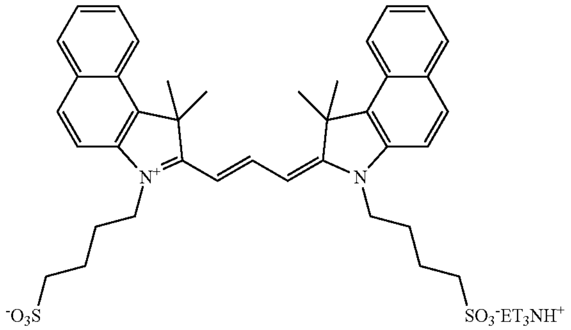

Proxel Ultra5, an aqueous 5 wt. % solution of 1,2 benzisothiazole-3(2H)-one from Arch Biocides UK.

TD1000, a developer from Agfa Graphics N.V.

RC795, a gum solution available from Agfa Graphics N.V.

Azura TS Gum, a gum solution available from Agfa Graphics N.V.

IR-01, a 1 wt. % ethanoUwater (1/1) solution of the following dye:

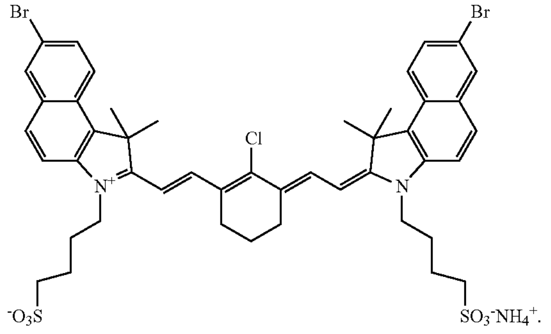

IR-02, a 1 wt. % ethanol/water (1/1) solution of the following dye:

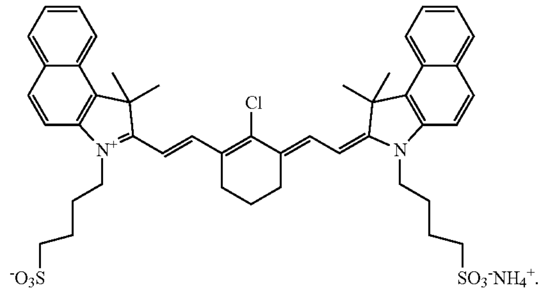

Preparation Thermoplastic Particles LX-01

The polymer emulsion was prepared by means of a seeded emulsion polymerisation using styrene and acrylonitrile as monomers. All surfactant (4.5% towards the total monomer amount) was present in the reactor before any monomer was added. In a double-jacketed reactor of 2 liter, 10.35 g of Chemfac PB-133, 1.65 g of $NaHCO_3$ and 1482.1 g of demineralised water was added. The reactor was flushed with nitrogen and heated until 75° C. When the reactor content reached a temperature of 75° C., 1.5% of the monomers were added (i.e. a mixture of 2.29 g styrene and 1.16 g acrylonitrile). The monomers were emulsified during 15 minutes at 75° C. followed by the addition of 37.95 gram of a 2% solution of sodium persulfate in water. The reactor was subsequently heated to a temperature of 80° C. during 30 minutes. Then, the remaining monomer mixture (150.1 g of styrene and 76.5 g of acrylonitrile) was dosed to the reaction mixture during 180 minutes. Simultaneously with the monomer addition, an additional amount of an aqueous persulfate solution was added (37.95 g. of a 2% aqueous $Na_2S_2O_8$ solution). After the monomer addition was completed, the reactor was heated for 60 minutes at 80° C. To reduce the amount of residual monomer a vacuum distillation was performed at 80° C. during 1 hour. The reactor was subsequently cooled to room temperature, 100 ppm Proxel Ultra 5 was added as biocide and the latex was filtered using coarse filter paper.

This resulted in a latex dispersion LX-01 with a solid content of 13.14 wt. % and a pH of 6.10. The average particle size is given in table 3.

The average particle size was 29 nm as measured using PL-PSDA (Polymer Laboratories Particle Size Diameter Analyser). Measured with BI-90 this resulted in a mean particle size of 31 nm.

Preparation Thermoplastic Particles LX-02

The polymer emulsion was prepared by means of a “seeded emulsion” polymerization wherein small part of the monomers (styrene and acrylonitrile) is added at the start of the polymerisation and a large part is slowly added to the reactor. All surfactant (2.5 wt. % towards the monomer amount) is present in the reactor before the monomer addition is started. In a 100 l double-jacketed reactor, 48.9 kg demineralised water and 400 gram of SDS Ultrapure was added. The reactor was brought under inert atmosphere by 3 times vacuum/nitrogen exchange and a nitrogen flow was kept of 1 $m^3$/h. The reactor content was stirred and heated until 75° C. A monomer mixture of 119 gram acrylonitrile and 233 grams of styrene was added to the reactor. The monomer is emulsified in the reactor during 15 minutes at 75° C. A 2% initiator solution was made by weighing 5174 grams of demineralised water and 106 grams of sodium persulfate. 2640 grams of the 2% sodium persulfate solution is added to the reactor (50% of the total amount). The reactor is stirred during 5 minutes and consequently the reactor is heated during 30 minutes from 75° C. to 80° C. Then the monomer mixture (5.28 kg acrylonitrile and 10.37 kg styrene) was dosed during 3 hours at 80° C. Simultaneously with the monomer addition an aqueous persulphate solution was added (2640 grams of a 2 wt. % sodiumpersulfate solution in water) during 3 hours. The monomer flask was flushed with 1 l of demineralised water and the initiator pump is flushed with 0.5 liter of demineralised water. After the monomer addition the reactor was heated during 60 min. at 80° C. To reduce the amount of residual monomer a redox-initiation system was added (69 g of sodium formaldehyde sulphoxylate dihydrate (SFS) dissolved in 5224 grams water and 114 g of a 70 wt. % t-butyl hydro peroxide (TBHP) diluted with 886 grams of water. The aqueous solutions of SFS and TBHP were added separately during 2 hours and 20 min. The reaction was then heated for another 10 min. at 80° C. and was subsequently cooled to room temperature. 152 g of a 5.25 wt. % aqueous solution of 5-bromo-5-nitro-1,3-dioxane was added as biocide and the latex was filtered using a 5 micron filter.

This resulted in the latex dispersion LX-02 with a solid content of 20.51 wt. % and a pH of 2.9. The average particle size is given in table 3.

The average particle size was 35 nm as measured using PL-PSDA (Polymer Laboratories Particle Size Diameter Analyser). Measured with BI-90 this resulted in a mean particle size of 39 nm.

TABLE 3

| | LX-01 | LX-02 |
|---|---|---|
| $Ø_{PCS}$ (nm) | 31 | 39 |
| $Ø_V$ (nm) | 29 | 35 |

Preparation of the Aluminum Substrate AS-01

A 0.3 mm thick aluminum foil was degreased by spraying with an aqueous solution containing 34 g/l NaOH at 70° C. for 6 seconds and rinsed with demineralised water for 3.6 seconds. The foil was then electrochemically grained during 8 seconds using an alternating current in an aqueous solution containing 15 g/l HCl, 15 g/l $SO_4^{2-}$ ions and 5 g/l $Al^{3+}$ ions at a temperature of 37° C. and a current density of about 100 A/$dm^2$ (charge density of about 800 C/$dm^2$). Afterwards, the aluminum foil was desmutted by etching with an aqueous solution containing 145 g/l of sulphuric acid at 80° C. for 5 seconds and rinsed with demineralised water for 4 seconds. The foil was subsequently subjected to anodic oxidation during 10 seconds in an aqueous solution containing 145 g/l of sulphuric acid at a temperature of 57° C. and a current density of 33 A/$dm^2$ (charge density of 330 C/$dm^2$), then washed with demineralised water for 7 seconds and post-treated for 4 seconds (by spray) with a solution containing 2.2 g/l PVPA at 70° C., rinsed with demineralised water for 3.5 seconds and dried at 120° C. for 7 seconds.

The support thus obtained is characterised by a surface roughness Ra of 0.35-0.4 μm (measured with interferometer NT1100) and an anodic weight of about 4.0 g/$m^2$.

Example 1

Preparation of the Printing Plate Precursors PPP-01 to PPP-13

The coating solutions of the printing plate precursors PPP-01 to PPP-13 were prepared using the materials as described above. The IR-dye was added as a 1 wt. % solution in water/ethanol (1/1). The stabilizer compounds were added as indicated in Table 4. The pH of the coating solution was adjusted to 4.1 with a diluted ammonia solution (ca. 3 wt. %) (except in the case of PPP-02 where the pH had to be adjusted with a solution of $HNO_3$). The coating solutions were coated on the aluminum substrate AS-01 with a coating knife at a wet thickness of 30 μm. After drying at 50° C. for 1 minute in a hot air oven, the printing plate precursors PPP-01 to PPP-13, of which the dry coating weight of the different components is given in Table 5, were obtained. The dry coating weights used in Table 5 refer to the weight of the ingredients as such and not to the weight of the solutions or dispersions of the ingredients, i.e. those mentioned in the material list above, used to prepare the precursors.

TABLE 4

| Stabilizer | Solution |
|---|---|
| ST-01 | 2 wt. % in DW* + $NH_3$ (50 wt % solution)** |
| ST-02 | 1 wt % solution in DW |
| ST-03 | 1 wt % solution in EtOH |
| ST-04 | 1 wt % solution in EtOH/water (1:1) |
| COMP-ST-01 | 1 wt % solution in DW |
| COMP-ST-02 | 1 wt % solution in DW |
| COMP-ST-03 | 1 wt % solution in EtOH |
| COMP-ST-04 | 1 wt % solution in DW |
| COMP-ST-05 | 1 wt % solution in DW |
| COMP-ST-06 | 1 wt % solution in MeOH/DW (1:1) |

TABLE 4-continued

| Stabilizer | Solution |
|---|---|
| COMP-ST-07 | 1 wt % solution in warm DW (50° C.) |
| COMP-ST-08 | 1 wt % solution in warm DW (50° C.) |

*DW = demineralised $H_20$
**pH of the solution is 8.7

TABLE 5

| Ingredients ($g/m^2$) | PPP-01 (COMP) | PPP-02 (INV) | PPP-03 (INV) | PPP-04 (INV) | PPP-05 (INV) |
|---|---|---|---|---|---|
| LX-01 | 0.3993 | 0.3993 | 0.3993 | 0.3993 | 0.3993 |
| IR-01 | 0.0653 | = | = | = | = |
| ST-01 | — | 0.0109 | — | — | — |
| ST-02 | — | — | 0.0099 | — | — |
| ST-03 | — | — | — | 0.0109 | — |
| ST-04 | — | — | — | — | 0.0144 |
| Pigment | 0.0200 | 0.0200 | 0.0200 | 0.0200 | 0.0200 |
| Dye | 0.0090 | 0.0090 | 0.0090 | 0.0090 | 0.0090 |
| Binder | 0.0261 | 0.0261 | 0.0261 | 0.0261 | 0.0261 |
| HEDP | 0.0150 | 0.0150 | 0.0150 | 0.0150 | 0.0150 |
| Surfactant | 0.0050 | 0.0050 | 0.0050 | 0.0050 | 0.0050 |
| Total | 0.5398 | 0.5507 | 0.5496 | 0.5507 | 0.5542 |

| Ingredients ($g/m^2$) | PPP-06 (COMP) | PPP-07 (COMP) | PPP-08 (COMP) | PPP-09 (COMP) | PPP-10 (COMP) |
|---|---|---|---|---|---|
| Latex LX-01 | 0.4658 | 0.4658 | 0.4658 | 0.3993 | 0.3993 |
| IR-01 | 0.0653 | = | = | = | = |
| COMP-ST-01 | 0.0095 | — | — | — | — |
| COMP-ST-02 | — | 0.0218 | — | — | — |
| COMP-ST-03 | — | — | 0.0099 | — | — |
| COMP-ST-04 | — | — | — | 0.0141 | — |
| COMP-ST-05 | — | — | — | — | 0.0166 |
| Pigment | 0.0200 | 0.0200 | 0.0200 | 0.0200 | 0.0200 |
| Dye | 0.0090 | 0.0090 | 0.0090 | 0.0090 | 0.0090 |
| Binder | 0.0236 | 0.0236 | 0.0236 | 0.0261 | 0.0261 |
| HEDP | 0.0150 | 0.0150 | 0.0150 | 0.0150 | 0.0150 |
| Surfactant | 0.0050 | 0.0050 | 0.0050 | 0.0050 | 0.0050 |
| Total | 0.6132 | 0.6215 | 0.6136 | 0.5539 | 0.5563 |

| Ingredients ($g/m^2$) | PPP-11 (COMP) | PPP-12 (COMP) | PPP-13 (COMP) |
|---|---|---|---|
| LX-01 | 0.4658 | 0.4658 | 0.3993 |
| IR-01 | 0.0653 | = | = |
| COMP-ST-06 | 0.0269 | — | — |
| COMP-ST-07 | — | 0.0119 | — |
| COMP-ST-08 | — | — | 0.0241 |
| Pigment | 0.0200 | 0.0200 | 0.0200 |
| Dye | 0.0090 | 0.0090 | 0.0090 |
| Binder | 0.0236 | 0.0236 | 0.0261 |
| HEDP | 0.0150 | 0.0150 | 0.0150 |
| Surfactant | 0.0050 | 0.0050 | 0.0050 |
| Total | 0.6306 | 0.6156 | 0.5639 |

Lithographic Evaluation

The printing plate precursors PPP-01 to PPP-13 were exposed at an addressability of 2400 dpi on a Creo TrendSetter 3244T (40 W head) IR-laser platesetter and this at respectively 210-180-150-120-90 mJ/cm$^2$ at 150 rotations per minute (rpm). At each exposure density value (mJ/cm$^2$) both a set of 200 lines per inch (lpi) Agfa Balanced Screening (ABS) screen patches (with nominal dot areas from 1% to 99%) and a set of Agfa CristalRaster (ACR) screen patches (with nominal dot areas from 1% to 99%) were exposed on the printing plate precursor. The nominal elementary micro-dot size of Agfa CristalRaster (ACR) screening at 2400 dpi is 20 μm.

After exposure the printing plate precursors were developed in a VA88 processor (from Agfa Graphics NV) with TD1000 developer (from Agfa Graphics NV) at 22° C. in the developer section and a 1:1 diluted RC795 gum solution (from Agfa Graphics NV) at 22° C. in the gumming section. The development speed amounted to 1.2 m/min.

After development and gumming the printing plates were mounted on a Heidelberg GTO52 printing press equipped with a Kompac III dampening system. A compressible blanket was used and printing was done with the fountain solution 4% Agfa Prima FS404AS (trademark of Agfa Graphics) and K+E 800 black ink (trademark of K&E). The following start-up procedure was used: first 5 revolutions with the dampening form rollers engaged, then 5 revolutions with both the dampening and ink form rollers engaged, then printing started. 1 000 prints were made on 80 g/m$^2$ offset paper.

Sensitivity

The sensitivity of the precursors was evaluated by determining the lowest exposure energy density (mJ/cm$^2$) at which 2% 200 lpi ABS dots are perfectly visible (by means of a 5× magnifying glass) on printed sheet 1 000. The results are given in Table 6.

Effect of Daylight Exposure on Lithographic Performance

A daylight stability evaluation was performed by exposing the precursors, prior to imagewise exposure and development, during respectively 2, 4, 8, 12, 16 and 24 hours to light from 2 fluorescent tubes of 58 W at a distance of 1.80 m from the precursors (ceiling): 1× Philips Fluorescent Tube 58 W 840 Cool White and 1× Philips Fluorescent Tube 58 W 830 Warm White. Additionally 2 halogen light bulbs of 1000 W (Philips R7S 1000 W 189 mm R7S) in uplighters were positioned at a distance of 0.40 m from the ceiling in a way that their light only reached the plate precursor in an indirect way (reflection from the white ceiling). The light intensity at the surface of the precursor amounted to about 1300 Lux (as measured with a SkyTronic digital Lux meter).

The evaluation was carried out using the following two printing performance parameters:

Density of the non-image areas on the printing plate upon exposure (150 mJ/cm$^2$) and development (D (non-image, plate)). The non-coated aluminium substrate was used here as a reference ("zero-ing" of densitometer).

Dot area of the 40% ACR patch on the printing plate upon exposure (150 mJ/cm$^2$) and development (Dot area (40% ACR, plate)).

The density of the non-image areas on the printing plate as well the dot area of the 40% ACR patch on the printing plate referred to above were all measured with a Gretag MacBeth densitometer type D19C.

In Table 6 the results of D (non-image, plate) and Dot area (40% JO ACR, plate) are given for all tested printing plate precursors after storage during 24 hours under daylight prior to imagewise exposure and development.

TABLE 6

| | D (non-image, plate) | Dot area (40% ACR, plate) | Sensitivity (mJ/cm$^2$) |
|---|---|---|---|
| PPP-01 (COMP) | 0.15 | 1 | 120 |
| PPP-02 (INV) | 0.04 | 53 | 120 |
| PPP-03 (INV) | 0.04 | 52 | 120 |
| PPP-04 (INV) | 0.07 | 52 | 120 |
| PPP-05 (INV) | 0.07 | 54 | 120 |
| PPP-06 (COMP) | 0.11 | 3 | 120 |

TABLE 6-continued

| | D (non-image, plate) | Dot area (40% ACR, plate) | Sensitivity ($mJ/cm^2$) |
|---|---|---|---|
| PPP-07 (COMP) | 0.10 | 4 | 120 |
| PPP-08 (COMP) | 0.11 | 3 | 120 |
| PPP-09 (COMP) | 0.13 | 35 | 120 |
| PPP-10 (COMP) | 0.10 | 34 | 120 |
| PPP-11 (COMP) | 0.11 | 30 | 120 |
| PPP-12 (COMP) | 0.13 | 7 | 120 |
| PPP-13 (COMP) | 0.13 | 17 | 120 |

From Table 6 it is clear that the comparative printing plate precursors PPP-01 and PPP-06 to PPP-13, after exposure for 24 hours to daylight, have a higher density in the non-image areas on the plate as compared to all inventive printing plate precursors PPP-02 to PPP-05. This indicates that the printing plate precursors according to the inventive examples have a better clean-out. The improved clean-out, i.e. removal of the non-image areas during development, may be due to the fact that less IR-dye is deteriorated during storage under daylight in the presence of a stabilizing compound according to claim 1.

From Table 6 it is also clear that the comparative printing plate precursors, after exposure for 24 hours to daylight, have a lower sensitivity. This is clear from the lower dot value of the 40% ACR patch on the plate, as compared to all inventive printing plate precursors. Again, this higher sensitivity may be the result of less deterioration of the IR-dye during storage under daylight in the presence of a stabilizing compound according to claim 1. Without exposure to daylight all printing plate precursors have a dot area (40% ACR, plate) value of about 55%.

From Table 6 it is also clear that all inventive printing plate precursors show a sensitivity (without exposure to daylight) which is similar to the sensitivity of the comparative printing plate precursors.

Example 2

Preparation of the Printing Plate Precursors PPP-14 to PPP-16

The coating solutions of the printing plate precursors PPP-14 to PPP-16 were prepared using the materials as described above. The IR-dye was added as a 1 wt. % solution in water/ethanol (1/1). The stabilizer compound ST-01 was added as a 1 wt. % solution in DW (made alkaline (pH 8.8) with $NH_3$ (50 wt. % solution)). The pH of the coating solutions was adjusted to 4.1 with a diluted ammonia solution (ca. 3 wt. %) (except in the case of PPP-15 and 16 where the pH had to be adjusted with a solution of $HNO_3$). The coating solutions were coated on the aluminum substrate AS-01 with a coating knife at a wet thickness of 30 μm. After drying at 50° C. for 1 minute in a hot air oven, the printing plate precursors PPP-14 to PPP-16, of which the dry coating weight of the different components is given in Table 7, were obtained. The dry coating weights used in Table 7 refer to the weight of the ingredients as such and not to the weight of the solutions or dispersions of the ingredients, i.e. those mentioned in the material list above, used to prepare the precursors.

TABLE 7

| Ingredients ($g/m^2$) | PPP-14 (COMP) | PPP-15 (INV) | PPP-16 (INV) |
|---|---|---|---|
| LX-02 | 0.4000 | = | = |
| IR-02 | 0.0530 | = | = |
| ST-01 | — | 0.0108 | 0.0216 |
| Pigment | 0.0200 | = | = |
| Dye | 0.0100 | = | = |
| Binder | 0.0320 | = | = |
| HEDP | 0.0250 | = | = |
| Surfactant | 0.0050 | = | = |
| Total | 0.5450 | 0.5558 | 0.5666 |

Lithographic Evaluation

The printing plate precursors were exposed as in example 1.

After exposure the printing plate precursors were cleaned out in an Azura C85 clean-out unit (from Agfa Graphics NV) with Azura TS Gum (from Agfa Graphics NV) at room temperature (22° C.) in the clean-out section. The dwell time in the clean-out section corresponded to 30 seconds.

After clean-out the printing plates were mounted on a Heidelberg GTO52 printing press equipped with a Kompac III dampening system. A compressible blanket was used and printing was done with the fountain solution 4% Agfa Prima FS404AS (trademark of Agfa Graphics) and K-FE 800 black ink (trademark of K&E). The following start-up procedure was used: first 5 revolutions with the dampening form rollers engaged, then 5 revolutions with both the dampening and ink form rollers engaged, then printing started. 1 000 prints were made on 90 $g/m^2$ matt-coated offset paper.

Sensitivity

The sensitivity of the precursors was evaluated by determining the lowest exposure energy density ($mJ/cm^2$) at which 2% 200 lpi ABS dots are perfectly visible (by means of a 5× magnifying glass) on printed sheet 1 000. The results are given in Table 8.

Effect of Daylight Exposure on Lithographic Performance

A daylight stability evaluation was performed by exposing the printing plate precursors, prior to imagewise exposure and development, during respectively 2, 4, 8, 12, 16 and 24 hours to light in an environmentally controlled light chamber. Said light chamber is a custom made design of a light carousel in a 800 liter climate chamber (Platinum PL-4 KPH from ESPEC EUROPE GmbH (Munich, Germany)). The light carousel comprises 32 fluorescent tubes of type Philips TL-D 30 W/54 with a broad band fluorescent type spectrum of ca. 6200 K correlated color temperature. The lamps are arranged equidistant to each other in the form of a cylinder with a radius of 214 mm. The fluorescent lamps are enclosed by a clear, non-UV-absorbing 4 mm thick plastic shield (PMMA), which transmits the complete spectrum of the TL bulbs down to 300 nm. The PMMA enclosure allows to ventilate the heat dissipated by the lamps via a separate exhaust, such that the lamp operation does not interfere with the temperature (T)/relative humidity (R.H.) control of the climate chamber. Furthermore, a carroussel type sample holder with octagonal cylindric shape is provided realizing 8 facets with 300 mm distance to the light carroussel axis. Printing plate precursor specimen are mounted with the functional coatings facing towards the lamps. The caroussel type holder rotates continuously around the cylindrical lamp assembly to provide homogenous exposure of the printing plate precursor specimen to light and T/R.H. This design results in a light homogeneity of better than 4% over the plate precursor sample plane across a facet. The light intensity at the surface of the plate precursor amounted to about 2000 Lux (+/−100

Lux) as measured with a PO1400 Pocket Lux Meter from LMT LICHTMESSTECHNIK GmbH (Berlin, Germany) in the center of the octagonal sample holders. The climate chamber is controlled at 25° C. (+/−1° C.) and 50% R.H. (+/−5% R.H.).

The evaluation was carried out using the following two printing performance parameters:

Colour of the printing plate precursor, as compared to the colour of a printing plate precursor that has not been exposed to any daylight (Delta E (plate precursor)).

Dot area of the 40% ACR patch on the printed sheet upon exposure (210 mJ/cm$^2$), clean-out and printing (Dot area (40% ACR, printed sheet)).

The colour of the printing plate precursor as referred to above was measured with a Gretag SpectroEye spectrophotometer (settings: D65—2°—absolute—no polarisation filter). The dot area of the 40% ACR patch on the printed sheet referred to above was measured with a Gretag MacBeth densitometer type D19C.

In Table 8 the results of Delta E (plate precursor) and Dot area (40% ACR, printed sheet) are given for all tested printing plate precursors after storage during 24 hours under daylight prior to imagewise exposure and clean-out.

TABLE 8

| | Delta E (plate precursor) | Dot area (40% ACR, printed sheet) | Sensitivity (mJ/cm$^2$) |
|---|---|---|---|
| PPP-14 (COMP) | 18 | 1 | 120 |
| PPP-15 (INV) | 11 | 66 | 120 |
| PPP-16 (INV) | 8.4 | 71 | 120 |

From Table 8 it is clear that the comparative precursor PPP-14, after exposure for 24 hours to daylight, shows a higher discoloration (change of colour) as compared to both printing plate precursors PPP-15 and 16 according to the inventive examples. From Table 8 it is also clear that the printing plate precursor according to the comparative example, after exposure for 24 hours to daylight, has a lower sensitivity. Without exposure to daylight all printing plate precursors allow for a dot area (40% ACR, printed sheet) value of about 73% on the printed sheet. It is also evident from these data that a higher concentration of stabilizing compound allows for a higher dot value of the 40% ACR patch on the printed sheet, indicating a lower degree of IR dye deterioration.

Example 3

Preparation of the Printing Plate Precursors PPP-17 to PPP-22

The coating solutions of the printing plate precursors PPP-17 to PPP-22 were prepared using the materials as described above. The IR-dye was added as a 1 wt. % solution in water/ethanol (1/1). The stabilizer compounds were added as indicated in Table 9. When preparing these coating solutions the stabilizer compound solutions were always added before the latex dispersion LX-02. The pH of the coating solution was adjusted to 4.1 with a diluted ammonia solution (ca. 3 wt. %) (except in the case of PPP-18 where the pH had to be adjusted with a solution of $HNO_3$). The coating solutions were coated on the aluminum substrate AS-01 with a coating knife at a wet thickness of 30 μm. After drying at 50° C. for 1 minute in a hot air oven, the printing plate precursors PPP-17 to PPP-22, of which the dry coating weight of the different components is given in Table 10, were obtained. The dry coating weights used in Table 10 refer to the weight of the ingredients as such and not to the weight of the solutions or dispersions of the ingredients, i.e. those mentioned in the material list above, used to prepare the precursors.

TABLE 9

| Stabilizer | Solution |
|---|---|
| ST-01 | 2 wt. % solution in DW + $NH_3$ (50 wt % solution)* |
| ST-07 | 1 wt. % solution in DW |
| ST-09 | 1 wt. % solution in Ethanol |
| ST-10 | 1 wt. % solution in DW |
| ST-03 | 1 wt. % solution in DW + HEDP (60 wt % solution)** |

*pH of the $NH_3$ solution is 8.7;
**pH of the HEDP solution is 2.2; molar ratio ST-03 to HEDP in the final solution is 1:1

TABLE 10

| Ingredients (g/m$^2$) | PPP-17 (COMP) | PPP-18 (INV) | PPP-19 (INV) | PPP-20 (INV) | PPP-21 (INV) | PPP-22 (INV) |
|---|---|---|---|---|---|---|
| Latex LX-02 | 0.4000 | = | = | = | = | = |
| IR-02 | 0.0530 | = | = | = | = | = |
| ST-01 | — | 0.0109 | — | — | — | — |
| ST-07 | — | — | 0.0185 | — | — | — |
| ST-09 | — | — | — | 0.0121 | — | — |
| ST-10 | — | — | — | — | 0.0150 | — |
| ST-03 | — | — | — | — | — | 0.0190 |
| Pigment | 0.0200 | = | = | = | = | = |
| Dye | 0.0100 | = | = | = | = | = |
| Binder | 0.0318 | = | = | = | = | = |
| HEDP | 0.0250 | = | = | = | = | = |
| Surfactant | 0.0050 | = | = | = | = | = |
| Total | 0.5548 | 0.5557 | 0.5633 | 0.5569 | 0.5598 | 0.5638 |

Lithographic Evaluation

The lithographic evaluation was performed as in Example 2.

Sensitivity

The sensitivity of all printing plate precursors PPP-17 to PPP-22 was evaluated as in Example 2. The results are given in Table 11.

Effect of Daylight Exposure on Lithographic Performance

The daylight stability evaluation was performed as in Example 1, the only difference being that the printing plate precursors were imaged with an energy density of 180 mJ/cm$^2$. The results are given in Table 11.

TABLE 11

| | D (non-image, plate) | Dot area (40% ACR, plate) | Sensitivity (mJ/cm$^2$) |
|---|---|---|---|
| PPP-17 (COMP) | 0.06 | 1 | 120 |
| PPP-18 (INV) | 0.09 | 51 | 120 |
| PPP-19 (INV) | 0.08 | 50 | 120 |
| PPP-20 (INV) | 0.07 | 50 | 120 |
| PPP-21 (INV) | 0.09 | 49 | 120 |
| PPP-22 (INV) | 0.03 | 54 | 120 |

From Table 11 it is clear that the comparative printing plate precursor PPP-17, after exposure for 24 hours to daylight, has a lower sensitivity compared with the inventive precursors PPP-18 to 22. This is clear from the lower dot value of the 40% ACR patch on the plate, as compared to all inventive printing plate precursors. Without exposure to daylight all printing plate precursors have a dot area (40% ACR, plate) value of about 55%.

Example 4

Preparation of the Printing Plate Precursors PPP-23 to PPP-27

The coating solutions of the printing plate precursors PPP-23 to PPP-27 were prepared using the materials as described above. The IR-dye was added as a 1 wt. % solution in water/ethanol (1/1). The stabilizer compounds were added as indicated in Table 12. When preparing these coating solutions the stabilizer compound solutions were always added before the latex dispersion LX-02. The pH of the coating solution was adjusted to 4.1 with a diluted ammonia solution (ca. 3 wt. %). The coating solutions were coated on the aluminum substrate AS-01 with a coating knife at a wet thickness of 30 μm. After drying at 50° C. for 1 minute in a hot air oven, the printing plate precursors PPP-23 to PPP-27, of which the dry coating weight of the different components is given in Table 13, were obtained. The dry coating weights used in Table 13 refer to the weight of the ingredients as such and not to the weight of the solutions or dispersions of the ingredients, i.e. those mentioned in the material list above, used to prepare the precursors.

TABLE 12

| Stabilizer | Solution |
|---|---|
| ST-04 | 1 wt % solution in EtOH/DW (1:1) |
| COMP-ST-09 | 1 wt. % solution in Ethanol |
| COMP-ST-10 | 1 wt. % solution in EtOH/DW (1:1) |
| ST-21 | 1 wt. % solution in DW |

TABLE 13

| Ingredients ($g/m^2$) | PPP-23 (COMP) | PPP-24 (INV) | PPP-25 (COMP) | PPP-26 (COMP) | PPP-27 (INV) |
|---|---|---|---|---|---|
| Latex LX-02 | 0.4000 | = | = | = | = |
| IR-02 | 0.0530 | = | = | = | = |
| ST-04 | — | 0.0138 | — | — | — |
| COMP-ST-09 | — | — | 0.0114 | — | — |
| COMP-ST-10 | — | — | — | 0.0121 | — |
| ST-21 | — | — | — | — | 0.0141 |
| Pigment | 0.0200 | = | = | = | = |
| Dye | 0.0100 | = | = | = | = |
| Binder | 0.0318 | = | = | = | = |
| HEDP | 0.0250 | = | = | = | = |
| Surfactant | 0.0050 | = | = | = | = |
| Total | 0.5548 | 0.5557 | 0.5633 | 0.5569 | 0.5598 |

Lithographic Evaluation

The lithographic evaluation was performed as in Example 2.

Sensitivity

The sensitivity of all printing plate precursors PPP-23 to PPP-27 was evaluated as in Example 2. The results are given in Table 14.

Effect of Daylight Exposure on Lithographic Performance

The daylight stability evaluation was performed as in Example 2, the only differences being that:

- the light intensity to which the printing plate precursors were exposed amounted to 2500 Lux (+/−100 Lux) (instead of 2000 Lux).
- the climate chamber was controlled at 25° C. (+/−1° C.) and 60% R.H. (+/−5% R.H.) (instead of 50% R.H.).
- the printing plate precursors were exposed to daylight during 16 hours (instead of 24 hours).
- the printing plate precursors were imaged with an energy density of 180 $mJ/cm^2$.

The evaluation was carried out using the following printing performance parameter:

- Dot area of the 40% ACR patch on the printed sheet upon exposure (180 $mJ/cm^2$), clean-out and printing (Dot area (40% ACR, printed sheet)).

The dot area of the 40% ACR patch on the printed sheet referred to above was measured with a Gretag MacBeth densitometer type D19C.

In Table 14 the results of Dot area (40% ACR, printed sheet) are given for all tested printing plate precursors after storage during 16 hours under daylight prior to imagewise exposure and clean-out.

The results are given in Table 14.

TABLE 14

| | Dot area (40% ACR, printed sheet) | Sensitivity ($mJ/cm^2$) |
|---|---|---|
| PPP-23 (COMP) | 0 | 120 |
| PPP-24 (INV) | 61 | 120 |
| PPP-25 (COMP) | 0 | 120 |
| PPP-26 (COMP) | 0 | 120 |
| PPP-27 (INV) | 67 | 120 |

From Table 14 it is clear that the printing plate precursors according to the comparative examples, after exposure for 16 hours to daylight, have a lower sensitivity. Without exposure to daylight all printing plate precursors allow for a dot area (40% ACR, printed sheet) value of about 65% on the printed sheet. From Table 14 (see PPP-25 and PPP-26) it is also clear that compounds containing a phenolic ring, the phenolic ring having at least one substituent according to Formula I, but also additional substituents having a Hammett sigma paravalue ($\sigma_p$) higher than 0.3, do not improve the daylight stability of the printing plate precursor.

The invention claimed is:

1. A method for preparing a lithographic printing plate comprising the steps of:

imagewise exposing a lithographic printing plate precursor comprising a coating provided on a support having a hydrophilic surface, the coating containing thermoplastic particles and an infrared radiation absorbing dye characterized in that the coating further comprises a compound of formula IV:

Formula IV

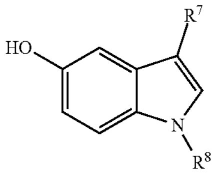

wherein $R^7$ and $R^8$ are independently selected from the group consisting of a hydrogen, an optionally substituted alkyl group, an optionally substituted alkenyl group, an optionally substituted alkynyl group, an optionally substituted alkaryl group, an optionally substituted aralkyl group and an optionally substituted aryl or heteroaryl group; and developing the exposed precursor in a gum solution.

2. The method according to claim 1, wherein the infrared radiation absorbing dye contains a substituent selected from bromo and iodo.

3. The method according to claim 2, wherein the infrared radiation absorbing dye has a structure according to Formula V;

Formula V

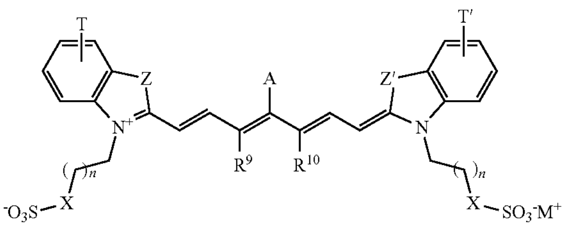

wherein

Z and Z' represent —S—, —$CR^aR^b$— or —CH═CH—;

A represents hydrogen, an optionally substitued alkyl, aralkyl or aryl group, halogen, —$OR^c$, —$SR^d$, —$SO_2R^e$, —$NR^fR^g$, —$NR^h(SO_2R^i)$ or —$NR^j(CO_2R^k)$ wherein $R^c$ represents an optionally substituted aryl group, $R^d$ represents an optionally substituted alkyl, aralkyl, aryl or heteroaryl group, $R^e$ represents an optionally substituted alkyl, aryl, or heteroaryl group, $R^f$ represents an optionally substituted alkyl, aralkyl or aryl group, $R^g$ represents an optionally substituted aryl group, $R^h$ represents an optionally substituted alkyl or aryl group, $R^i$ represents an optionally substituted alkyl or aryl group or —$NR^{i1}R^{i2}$ wherein $R^{i1}$ and $R^{i2}$ represent hydrogen, an optionally substituted alkyl or aryl group, $R^j$ represents an optionally substituted alkyl or aryl group;

T and T' independently represent hydrogen, alkyl, alkoxy, cyano, —$CO_2R^k$, —$CONR^lR^m$, —$SO_2R^n$, —$SO_2NR^oR^p$ or an annulated benzo ring wherein $R^l$, $R^m$ represent hydrogen, an optionally substituted alkyl or aryl group, $R^n$ represents an optionally substituted alkyl or aryl group and $R^o$ and $R^p$ represent hydrogen, an optionally substituted alkyl or aryl group;

$R^9$ and $R^{10}$ represent the necessary atoms to form a ring;

n represents an integer ranging from 0 to 3;

X represents —$CH_2$—, —O— or —S—;

$M^+$ represents a counterion to balance the charge.

4. The method according to claim 1, wherein the infrared radiation absorbing dye has a structural element according to Formula VI;

Formula VI

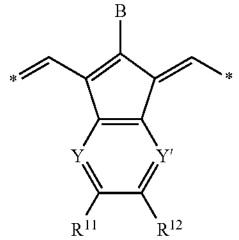

wherein

B represents hydrogen, halogen or a monovalent organic group;

Y and Y' independently represent —CH— or —N—;

$R^{11}$ and $R^{12}$ independently represent hydrogen, an optionally substituted alkyl or aryl group or represent the necessary atoms to form a ring;

* represent the linking positions to the rest of the molecule.

5. The method according to claim 1, wherein the thermoplastic particles have an average particle diameter, measured by Photon Correlation Spectrometry, between 20 and 55 nm.

6. The method according to claim 1, wherein the developing step is carried out off press in an automated processing unit comprising rotating brushes.

7. The method according to claim 2, wherein the thermoplastic particles have an average particle diameter, measured by Photon Correlation Spectrometry, between 20 and 55 nm.

8. The method according to claim 3, wherein the thermoplastic particles have an average particle diameter, measured by Photon Correlation Spectrometry, between 20 and 55 nm.

9. The method according to claim 2, wherein the developing step is carried out off press in an automated processing unit comprising rotating brushes.

10. The method according to claim 3, wherein the developing step is carried out off press in an automated processing unit comprising rotating brushes.

* * * * *